United States Patent

Ghosh et al.

[11] Patent Number: 6,060,728
[45] Date of Patent: May 9, 2000

[54] ORGANIC LIGHT EMITTING DEVICE STRUCTURE AND PROCESS

[75] Inventors: Amalkumar P. Ghosh, Poughkeepsie; Gary W. Jones, Lagrangeville, both of N.Y.

[73] Assignee: FED Corporation, Hopewell Junction, N.Y.

[21] Appl. No.: 09/094,731

[22] Filed: Jun. 15, 1998

Related U.S. Application Data

[60] Provisional application No. 60/071,109, Jan. 12, 1998.

[51] Int. Cl.$^7$ .................................................. H01L 33/00
[52] U.S. Cl. ............................ 257/93; 257/88; 257/94; 257/98
[58] Field of Search .................. 257/93, 98, 88, 257/642, 643, 635, 94

[56] References Cited

U.S. PATENT DOCUMENTS

| | | | |
|---|---|---|---|
| 4,229,736 | 10/1980 | Rougeot | 340/782 |
| 4,663,832 | 5/1987 | Jambotkar | 29/576 |
| 4,839,303 | 6/1989 | Tully et al. | 437/31 |
| 4,879,587 | 11/1989 | Jerman et al. | 357/55 |
| 4,984,034 | 1/1991 | Yamazaki | 257/88 |
| 5,468,900 | 11/1995 | Daum | 257/632 |
| 5,693,962 | 12/1997 | Shi et al. | 257/89 |

*Primary Examiner*—David Hardy
*Assistant Examiner*—Huy Bui
*Attorney, Agent, or Firm*—Collier, Shannon, Rill & Scott, PLLC

[57] ABSTRACT

Isolation structures and means for isolating the electron injectors in an organic light emitting device are disclosed. The isolation structures may reduce the likelihood of electrical shorts or cross-talks between adjacent columns of electron injector material. The isolation structures may comprise multiple layers of distinct material, including a layer of organic insulation material, such as photoresist or other hydrophobic organic material. The insulation material may be spin or extrusion coated onto the device. The insulation material may be sandwiched between inorganic oxide layers. The insulation material may be selected such that it is capable of being preferentially etched relative to the oxide layers by dry etching methods such as oxygen plasma. Alternatively, the insulation material may be made of material that does not have a very strong adhesion to an underlying oxide layer, so that the insulation material and any conductive material formed on top of it may be removed using a tape lift-off process. Methods for making the aforementioned isolation structures are also disclosed.

15 Claims, 4 Drawing Sheets

ORGANIC LIGHT EMITTING DEVICE STRUCTURE AND PROCESS

CROSS REFERENCE TO RELATED PATENT APPLICATION

This application relates to and claims priority on provisional application Ser. No. 60,071,109 filed Jan. 12, 1998 and entitled "Organic Light Emitting Device Structure and Process".

FIELD OF THE INVENTION

The present invention relates to organic light emitting device (OLED) structures and a method of making thereof. In particular, the present invention may reduce the likelihood of electrical shorts and cross-talks between adjacent electron injector columns in the OLED.

BACKGROUND OF THE INVENTION

An OLED can be formed so that it is down emitting and the invention may be particularly useful for such down emitting OLEDs. Down emitting means that the OLED emits light through the substrate on which the OLED is formed and is viewed through the substrate on which it is formed.

With reference to FIG. 1, a simplified structure over which a down emitting OLED 10 is built, is shown. The OLED 10 may include a transparent substrate 100 on which plural hole injector lines 200 are formed. The hole injector lines 200 may typically comprise indium tin oxide (ITO). Substantially perpendicular to, and overlying the hole injector lines 200 may be columns of organic light emitting material 300. The organic light emitting material may be referred to as an organic stack because a stack of different organic materials is often required in order for the overall stack to emit light of a desired wavelength. Electron injector columns 400 (e.g. Mg/Ag) may overlie the organic stack columns 300.

A pixel may be formed at each portion of the organic stack that is sandwiched between a section of a hole injector line 200 and a section of an electron injector column 400. Light may be generated in a pixel when the appropriate voltages are simultaneously applied to the respective hole injector line 200 and electron injector column 400 that lie below and above the pixel. The generated light is emitted downward through the substrate 100 because the electron injector columns 400 are provided with a reflective coating, and the hole injector lines 200 and substrate 100 are transparent.

In order for the OLED 10 to operate properly, the electron injector columns 400 must be electrically isolated from each other. The process for making down emitting OLEDs may often end with the formation of electron injector columns 400 on top of the device 10. If the electron injector columns 400 are not appropriately isolated from each other, there is opportunity for cross-talk and electrical shorts between the electron injector columns.

With reference to FIG. 2, in which like reference numerals refer to like elements, one method of reducing the likelihood of cross-talk and electrical shorts between the electron injector columns 400 is to provide isolation columns 500 between each of the electron injector columns. The isolation columns 500 may provide a physical barrier of non-conductive material between the electron injector columns 400. The presence of the isolation columns 500 makes it more difficult for a short or cross-talk to occur.

A particular OLED design with isolation columns may be described with reference to the device 10 shown in FIG. 3.

The device 10 may include isolation columns 500 comprising a bottom inorganic SiO layer 510 (which may alternatively include dielectric materials, e.g., $Si_3N_4$, $Al_2O_3$, AlN, or diamond like carbon DLC), an intermediate inorganic $SiO_2$ layer 520, and a top inorganic SiO layer 530.

The device 10 shown in FIG. 3 may be formed by providing a first photoresist mask on the top of the device prior to the formation of the isolation columns 500. The first mask may be in the form of parallel spaced columns of photoresist material. The bottom SiO layer 510 may be formed be applying a blanket coating of SiO over the first mask and then removing the mask along with the SiO formed on top of the mask. After the formation of the bottom inorganic SiO layer 510, blanket coatings of inorganic $SiO_2$ or other materials that can be differentially etched may be applied. Following the application of $SiO_2$, a second layer of SiO may be applied to the top of the device 10. A second photoresist mask pattern of columns may then be formed on top of the top blanket layer of SiO. The isolation columns 500 may be completed by a RIE process of the top SiO layer and intermediate $SiO_2$ layers through openings in the second photoresist mask. Following the RIE process, the $SiO_2$ layer may be further etched using Buffered Oxide Etch (BOE) to complete the removal of the $SiO_2$ layer.

The device 10 may be completed by providing blanket coatings of organic stack material 300 and electron injector material to the upper surface of the device. The overhang of the top SiO layer 530 is required to provide a separation distance d between the electron injector material 402 in the channel 502 and the electron injector material 404 on top of the top SiO layer 530. Increasing distance d tends to decrease the likelihood of electrical shorts and cross-talk between the electron injectors in adjacent channels 502. Without separation distance d, the electron injector material 404 on top of the top SiO layer 530 could provide a circuit bridge between the electron injector material 402 and the electron injector material in the next channel to the left or right (not shown).

The device 10 shown in FIG. 3, as well as the associated method, provides excellent structural integrity (i.e. the device holds together well) and is free from any residual moisture. The existence of the electron injector material 404 on top of the top SiO layer 530 may provide enough of a conductive bridge to interfere with the isolation function of the isolation columns 500.

One way to enhance the isolation function of the isolation columns 500 shown in FIG. 3, may be to increase the overall thickness of the isolation column 500, thereby increasing separation distance d. Increasing distance d tends to reduce the likelihood of electrical shorts and cross-talks between adjacent electron injector columns that may be caused by particles or contamination on the surface of the device 10. However, the thickness of the intermediate $SiO_2$ layer 520, which may account for a substantial portion of the overall thickness of the isolation column 500, is limited by several factors. One such limitation is throughput of the evaporation process and ultimately of the product, i.e. the thickness of the $SiO_2$ layer is limited by the amount of $SiO_2$ material that can be applied per evaporation run, or per unit time. It may be prohibitively time consuming and labor intensive to subject the device 10 to the number of evaporation runs that are required for an $SiO_2$ layer the desired thickness for an effective isolation column. Another limitation is that of top patterned photoresist mask integrity during RIE processing. The photoresist mask may erode if the RIE process is prolonged, as is required when the $SiO_2$ layer is made thicker.

Another way to enhance the isolation function of the isolation columns 500 may be to remove the electron injector material 404 on top of the top SiO layer 530. Removal of the electron injector material 404 may effectively increase the distance d between the electron injector material 402 disposed in adjacent channels 502.

OBJECTS OF THE INVENTION

It is an object of the present invention to isolate electron injector columns in an OLED.

It is another object of the present invention to provide a method of making an OLED that includes structure for isolating electron injector columns in the OLED.

It is still another object of the present invention to provide an OLED with isolation columns that reduce the likelihood of cross-talk and/or electrical shorts between adjacent electron injector columns.

It is yet another object of the present invention to provide isolation columns in an OLED that have an undercut structure.

It is still yet another object of the present invention to provide isolation columns of increased thickness.

It is still yet another object of the present invention to provide a dry lift-off process, such as tape lift-off, to remove an organic stack and/or electron injector material from the top of an isolation column in an OLED.

Additional objects and advantages of the invention are set forth, in part, in the description which follows and, in part, will be apparent to one of ordinary skill in the art from the description and/or from the practice of the invention.

SUMMARY OF THE INVENTION

In response to the foregoing challenge, Applicants have developed an innovative organic light emitting device comprising: a substrate having a hole injector line formed thereon; two spaced isolation columns overlying and substantially perpendicular to said hole injector line, wherein each said isolation column comprises a lower layer of inorganic material and an upper layer of insulation material; an organic stack column overlying the hole injector line in a channel region defined by the two spaced isolation columns; and an electron injector column overlying the organic stack column.

Applicants have also developed an innovative method of making an organic light emitting device comprising the steps of: providing a substrate having a hole injector line formed thereon; providing two substantially parallel isolation columns overlying the hole injector line and being substantially perpendicular to said hole injector line, wherein an exposed portion of the hole injector line lies between the isolation columns, and wherein each isolation column comprises a lower layer of inorganic material and an upper layer of insulation material; providing organic stack material on the exposed portion of the hole injector line; and providing electron injector material on the organic stack material.

Applicants have further developed an innovative method of making an organic light emitting device comprising the steps of: providing a substrate having a hole injector line formed thereon; providing two substantially parallel isolation columns overlying the hole injector line and being substantially perpendicular to said hole injector line, wherein an exposed portion of the hole injector line lies between the isolation columns, and wherein each isolation column comprises a lower layer of SiO, an intermediate layer of $SiO_2$, and an upper layer of SiO; providing a layer of polyimide on the upper layer of SiO; providing organic stack material on the layer of polyimide and on the exposed portion of the hole injector line; providing electron injector material on the organic stack material; and lifting off the polyimide, organic stack material, and electron injector material that overlie the upper layer of SiO.

It is to be understood that both the foregoing general description and the following detailed description are exemplary and explanatory only, and are not restrictive of the invention as claimed. The accompanying drawings, which are incorporated herein by reference, and which constitute a part of this specification, illustrate certain embodiments of the invention, and together with the detailed description serve to explain the principles of the present invention.

BRIEF DESCRIPTION OF THE DRAWINGS

The invention will now be described in conjunction with the following drawings in which like reference numerals designate like elements and wherein.

DETAILED DESCRIPTION OF THE PREFERRED EMBODIMENT

Figure 4:
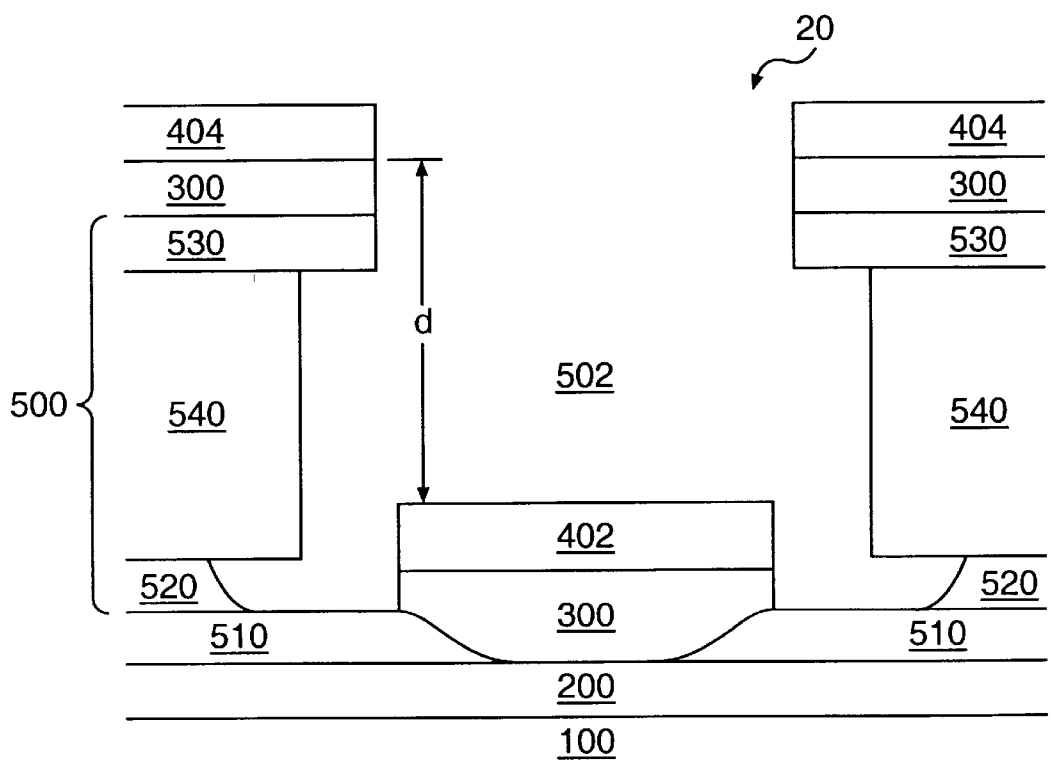
FIG. 4 is a cross-section in elevation of the channel region between two isolation columns of an organic light emitting device according to an embodiment of the present invention.

Reference will now be made in detail to a preferred embodiment of the present invention, an example of which is illustrated in the accompanying drawings. With reference to FIG. 4, in which like reference numerals refer to like elements to those in the previously discussed figures, a cross-sectional view in elevation of the channel region between two isolation columns of an organic light emitting device 20 is shown. Device 20 may include a transparent substrate 100 having a hole injector line 200 formed thereon. The substrate 100 may comprise glass, plastic, or other suitable material. The hole injector line 200 may also be transparent, and may preferably comprise indium tin oxide (ITO), or alternatively indium zinc oxide (IZO).

Overlying the hole injector line 200 may be plural, substantially parallel, spaced isolation columns 500. The isolation columns 500 may be relatively thin strips of material that run substantially perpendicular to the run of the hole injector line 200. An exposed portion of the hole injector line 200 may lie between each adjacent pair of isolation columns 500.

Each isolation column may include a lower layer of inorganic material that may comprise a first sublayer 510 and a second sublayer 520. In a preferred embodiment the first sublayer 510 may comprise a 2000 to 4000 Angstrom thick layer of SiO, and the second sublayer 520 may comprise a 15,000 to 30,000 Angstrom thick layer of $SiO_2$. Each of the foregoing SiO and $SiO_2$ layers may alternatively be other dielectrics that can be differentially etched.

Each isolation column may further include an upper layer of insulation material 540, that may comprise photoresist, polyimide, or other organic material. The thickness of the insulation material in layer 540 can be increased (as compared with the $SiO_2$ layer 520 in FIG. 3) because layer 540 comprises a layer of low moisture retaining material that can be spin coated and etched with oxygen plasma. Spin coating photoresist, as compared to the typical deposition of $SiO_2$, enables a much thicker coating of material to be applied per unit time. Therefore, replacement of the $SiO_2$ with photoresist, for example, may reduce processing time and increase distance d as compared with the structure shown in FIG. 3. The reduction in processing time may be substantial if the layer of insulation material 540 is to be on the order of 5 microns thick, as may be desired.

With continued reference to FIG. 4, each isolation column may further include a top layer of inorganic material 530, such as SiO, on the upper layer of insulation material 540. The top layer of inorganic material 530 may be in the range of 8000 to 12,000 Angstroms thick and may overhang the underlying layer of insulation material 540.

Figure 1:
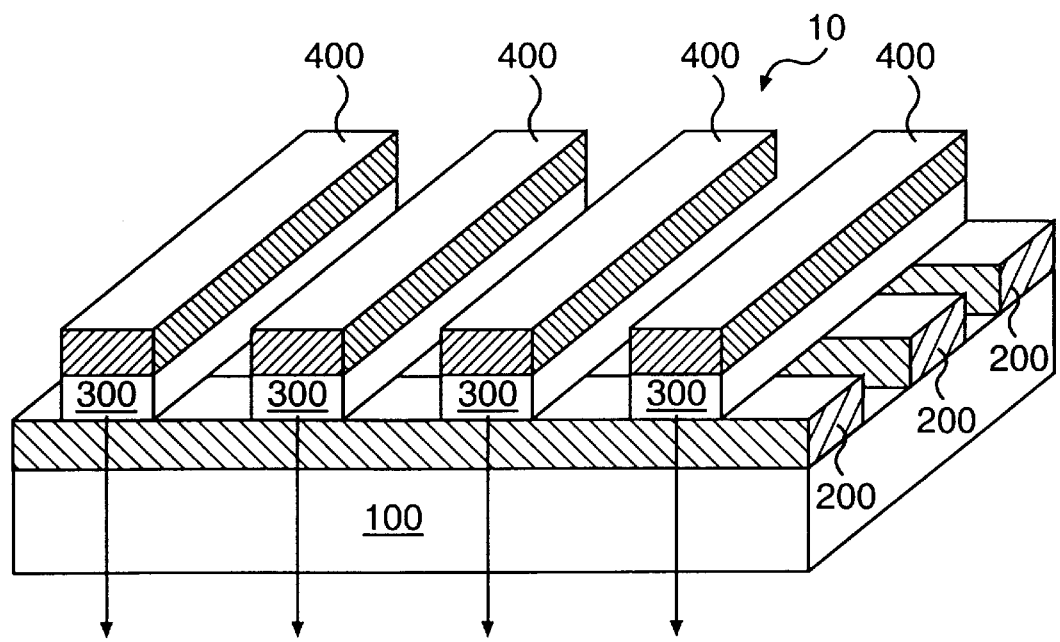
FIG. 1 is a pictorial view of a down emitting OLED.
Figure 2:
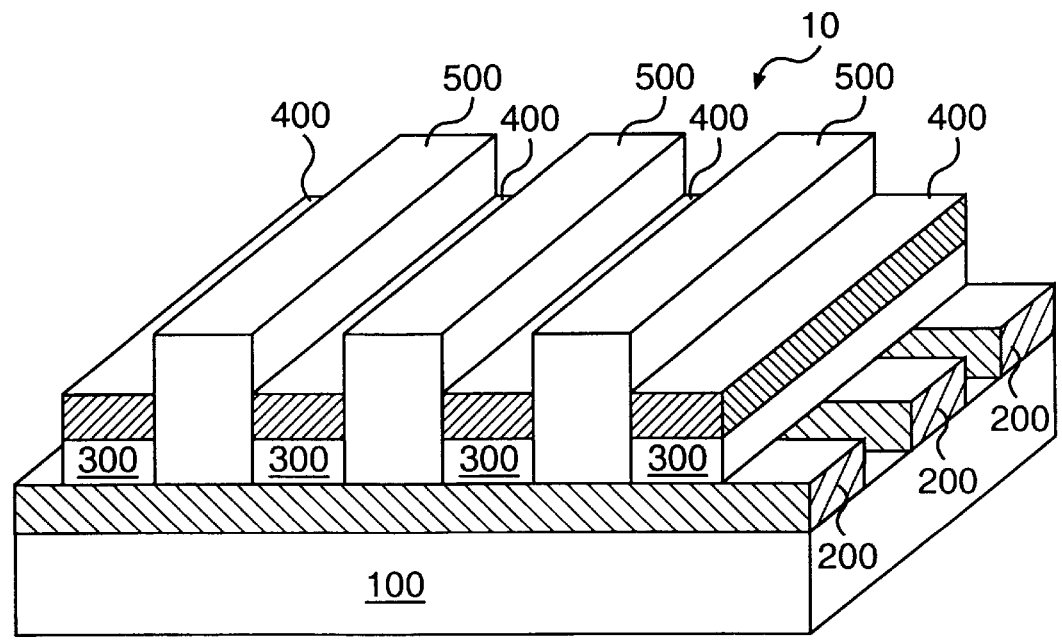
FIG. 2 is a pictorial view of a down emitting OLED that includes isolation columns between the electron injector columns.
Figure 3:
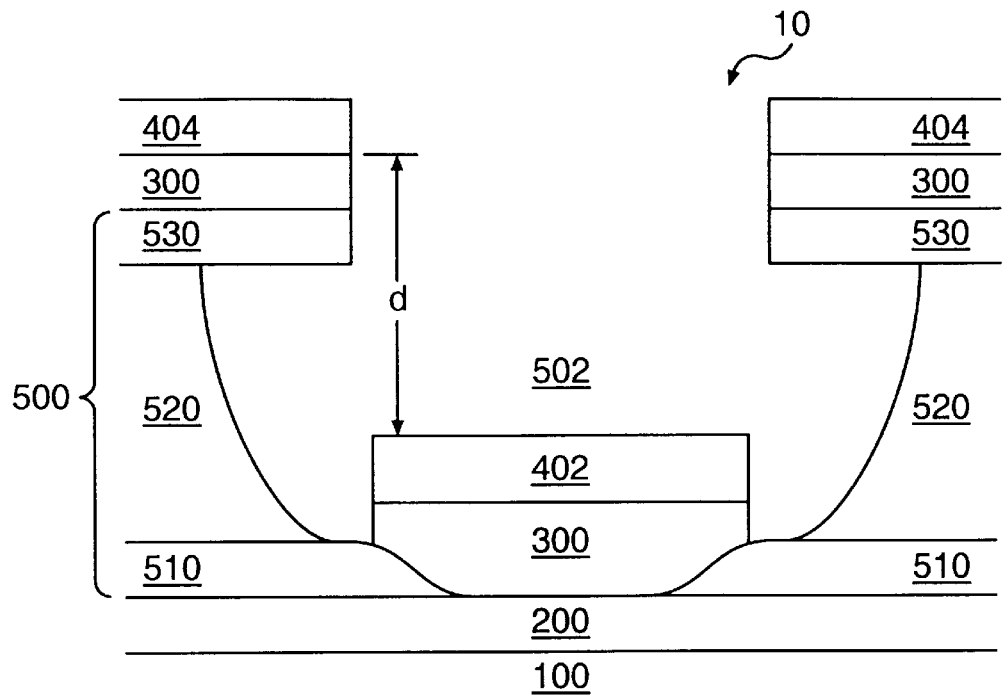
FIG. 3 is a cross-section in elevation of the channel region between two isolation columns of an organic light emitting device.

The remainder of the device 20 in FIG. 4 may be the same as that shown in FIG. 3. The device 20 may include organic stack material 300 overlying the hole injector line 200 in a channel region defined by the two spaced isolation columns 500. Organic stack material 300 may also be provided on top of the top layer of inorganic material 530. Electron injector material may be provided in columns 402 and 404 overlying the organic stack material 300.

Device 20 may be made starting with a substrate 100 with hole injector lines 200 provided thereon. A photoresist mask may be formed on the upper surface of the device, overlying the hole injector lines 200. The mask may have openings therein adapted to produce thin parallel columns that are perpendicular to the hole injector lines 200. A layer of first inorganic material, such as SiO, or SiN, may then be deposited on the upper surface of the device 20 by an evaporation process to form columns of inorganic material 510. The photoresist mask may then be removed so that parallel columns of inorganic material 510 remain.

Next, a blanket layer of second inorganic material ($SiO_2$ preferred) may be deposited on the upper surface of the device 20 by either an evaporation or sputtering process. The layer of second inorganic material 520 is preferably a wet etchable insulator. This wet etchable insulator layer may be selected so that it is etchable relative to the layer of insulation material 540 that is to be formed directly above it. An example of such a second inorganic material is $SiO_2$. A layer of $SiO_2$ can be easily etched using BOE, without affecting the organic insulation layer 540 which will subsequently overlie the $SiO_2$.

Thereafter, a blanket layer of insulation material 540 (photoresist preferred) may be spin coated on top of the layer of second inorganic material 520. Insulation material 540 is preferably organic material and may be provided by any insulation material that is hydro-phobic and can be spin cast, extrusion coated, or similarly applied in a relatively thick coat. A five micron layer of negative tone photoresist can be spin coated and pre-baked, flood exposed and post-baked in a shorter time than would be required for evaporation of a five micron layer of $SiO_2$. A positive tone photoresist process can also be used.

Subsequent to the formation of the layer of insulation material 540, a blanket layer of SiO 530 may be deposited thereon by evaporation. A second photoresist mask may be formed over the top layer of SiO. The second photoresist mask provides a pattern for the subsequent RIE process. The top layer of SiO 530 may then be anisotropically etched by applying $CF_4$ gas through holes in the mask during a RIE process.

Next, the insulation layer 540 may be isotropically etched using an oxygen plasma process to form an undercut in the insulation layer. The oxygen plasma process may clear the resist in its entirety. However, due to the nature of this process a roughened surface of insulation material may be created on the layer of second inorganic material 520 at the interface of the second inorganic material and the insulation layer 540. This rough surface is known as "RIE Grass". The RIE Grass is very difficult to remove by dry or wet etching processes because it is made of very tough polymeric material, similar to Teflon.

Inclusion of the second inorganic layer 520 may provide a solution to the RIE grass problem because the grass may be lifted out in its entirety using a BOE of the second inorganic layer. In addition, the BOE of the second inorganic layer 520 may provide a desirable undercut of that layer beneath the overlying insulation layer 540. This undercut may help reduce the likelihood of electrical shorts and cross-talks. When the second inorganic layer 520 comprises $SiO_2$, the layer may be in the range of about 5000 Angstroms thick, and may provide an adequate undercut after approximately 5 minutes of BOE (assuming BOE with a concentration of 1:15).

Furthermore, a $SiO_2$ second inorganic layer 520 may provide an etch stop for the oxygen plasma process used to etch the overlying insulation layer 540. If the second inorganic layer 520 did not provide an etch stop, the oxygen plasma could come into contact with the hole injector layer 200, which is undesirable because it may alter the hole injection characteristics of that layer.

Figure 5:
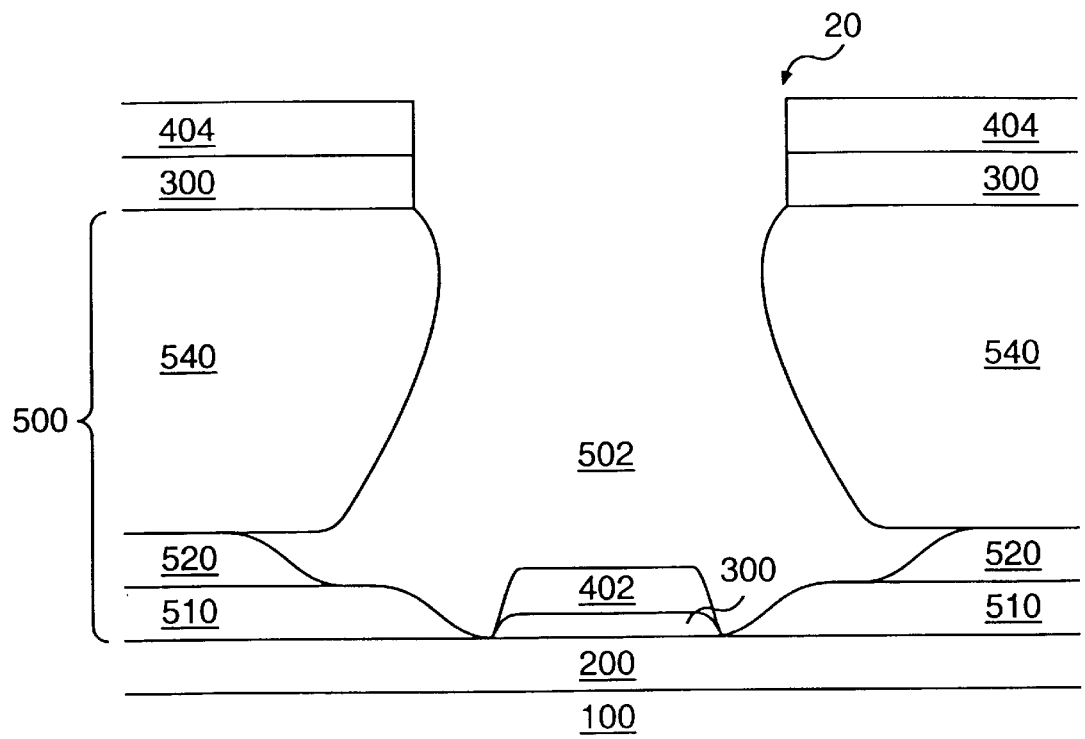
FIG. 5 is a cross-section in elevation of the channel region between two isolation columns of an organic light emitting device according to an alternative embodiment of the present invention.

With reference to FIG. 5, in an alternative embodiment of the invention, the upper organic layer 540 may comprise a layer of polyimide in the range of 5 to 10 microns thick. When the upper organic layer 540 comprises polyimide, the top layer of inorganic material 530 may not be provided on the device. The device 20 shown in FIG. 5 may be formed by lithographically patterning photosensitive polyamide over the lower inorganic layer 520. Use of polyimide as the upper organic layer 540 may eliminate the need for a top inorganic layer. The polyimide may be etched isotropically to achieve an undercut structure, as shown in FIG. 5.

Figure 6:
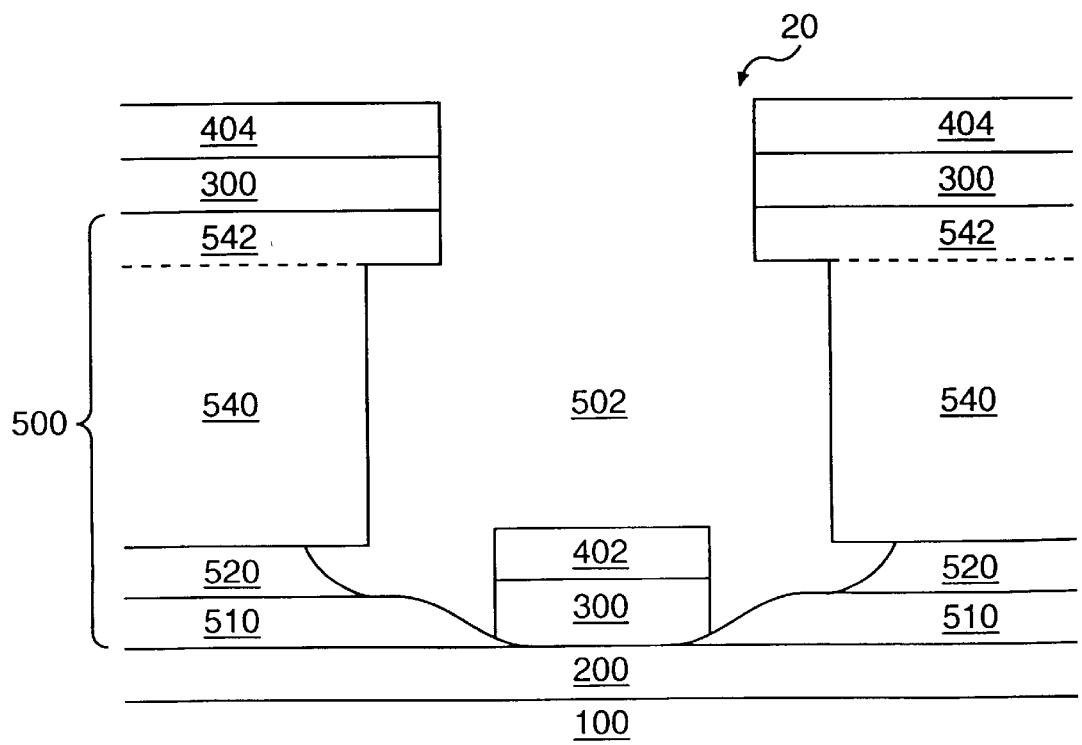
FIG. 6 is a cross-section in elevation of the channel region between two isolation columns of an organic light emitting device according to a second alternative embodiment of the present invention.

With reference to FIG. 6, in a second alternative embodiment of the invention, the upper organic layer 540 may comprise a hardened top layer of organic material 542. If the upper organic layer 540 comprises photoresist or photosensitive polyamide, for example, then the hardened top layer 542 may be formed by using either a chemical process or a radiation process. The hardened top layer 542 may act as a mask for a subsequent plasma process that may result in the device profile shown in FIG. 6. The organic stack 300 may then be evaporated into the channel 502 at a larger angle than the electron injector layer 402. This may prevent the electron injector layer 402 from shorting to the hole injector layer 200.

Figure 7:
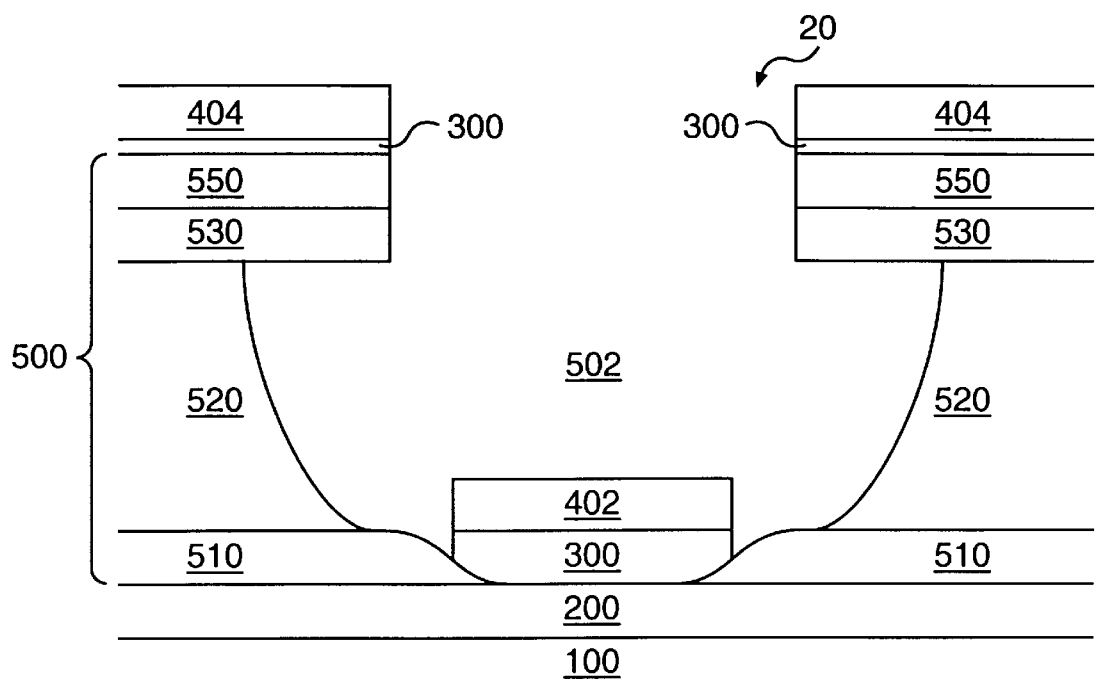
FIG. 7 is a cross-section in elevation of the channel region between to isolation columns of an organic light emitting device according to a third alternative embodiment of the present invention.

With reference to FIG. 7, another alternative embodiment of the invention is shown, in which like reference numerals refer to like elements of the aforementioned figures. A layer of polymeric material 550, such as polyamide or any other material that does not have very strong adhesion properties to SiO, may be deposited on the top layer of inorganic material 530 (SiO). Following deposition of the organic stack 300 and the electron injector layer 404, the cathode, those layers may be removed along with the underlying polymeric material 550 using a tape lift-off process. In this method an adhesive tape may be adhered to the electron injector layer 404 on top of the isolation columns 500. The tape (not shown) should be carefully laid down so that it contacts only the top surface of electron injector layer 404. The tape may then be gently pulled off and with it the layers 550, 300, and 404. Typically, the layer of polymeric material 550 in contact with the top layer of SiO 530, may have poor adhesion to the SiO, and will come off with the tape. Another variation on the foregoing method of removing the electron injector layer 404 involves using a laser ablation process.

It will be apparent to those skilled in the art that various modifications and variations can be made in the construction, configuration, and/or operation of the present invention without departing from the scope or spirit of the invention. For example, in the embodiments mentioned above, the inorganic layers may comprise materials other than SiO or $SiO_2$ without departing from the scope of the invention. The above described structures and process methods can be used on a device having any kind of substrate material, such as glass, metal, silicon or flexible plastic. Variations in the shapes, sizes, and undercuts of the layers in the isolation columns may also be made without departing from the scope and spirit of the invention. Further, it may be appropriate to make additional modifications or changes to the process for providing each of the layers in the disclosed devices without departing from the scope of the invention. Thus, it is intended that the present invention cover the modifications and variations of the invention provided they come within the scope of the appended claims and their equivalents.

We claim:

1. An organic light emitting device comprising:
   a substrate having a hole injector line formed thereon;
   two spaced isolation columns overlying and substantially perpendicular to said hole injector line, wherein each said isolation column comprises a lower layer of inorganic material and an upper layer of insulation material, wherein said lower layer of inorganic material comprises a sublayer of $SiO_2$ and said sublayer of $SiO_2$ is undercut beneath said upper layer of insulation material;
   an organic stack column overlying the hole injector line in a channel region defined by the two spaced isolation columns; and
   an electron injector column overlying the organic stack column.

2. The device of claim 1 wherein said upper layer of insulation material comprises an organic material.

3. The device of claim 1 wherein said upper layer of insulation material comprises photoresist material.

4. The device of claim 3 further comprising a hardened top portion formed in said upper layer of insulation material.

5. The device of claim 4 wherein said hardened top portion overhangs the remainder of said upper layer of insulation material.

6. The device of claim 1 wherein said upper layer of insulation material comprises polyimide.

7. The device of claim 1 further comprising a layer of SiO overlying the upper layer of insulation material.

8. The device of claim 1 wherein said lower layer of inorganic material comprises a sublayer of SiO underlying a sublayer of $SiO_2$.

9. The device of claim 1 wherein said upper layer of insulation material comprises a hydro-phobic material that is capable of being spin cast.

10. An organic light emitting device that is a product of the process comprising the steps of:
    providing a substrate having a hole injector line formed thereon;
    providing two substantially parallel isolation columns overlying the hole injector line and being substantially perpendicular to said hole injector line, wherein an exposed portion of the hole injector line lies between the isolation columns, and wherein each isolation column comprises a lower layer of SiO, an intermediate layer of $SiO_2$, and an upper layer of SiO, wherein said intermediate layer of $SiO_2$ is undercut beneath said upper layer of SiO;
    providing a layer of polyimide on the upper layer of SiO;
    providing organic stack material on the layer of polyimide and on the exposed portion of the hole injector line;
    providing electron injector material on the organic stack material; and
    lifting off the polyimide, organic stack material, and electron injector material that overlie the upper layer of SiO.

11. An organic light emitting device comprising:
    a substrate having a hole injector line formed thereon;
    two spaced isolation columns overlying and substantially perpendicular to said hole injector line, wherein each of said isolation columns comprises a lower layer of inorganic material and an upper layer of insulation material, wherein said upper layer includes a hardened top portion formed therein;
    an organic stack column overlying the hole injector line in a channel region defined by the two spaced isolation columns; and
    an electron injector column overlying the organic stack column.

12. The device according to claim 11, wherein said lower layer of inorganic material comprises a sublayer of $SiO_2$.

13. The device according to claim 12, wherein said sublayer of $SiO_2$ is undercut beneath said upper layer of insulation material.

14. The device according to claim 11, wherein said lower layer of inorganic material comprises a sublayer of SiO underlying a sublayer of $SiO_2$.

15. The device according to claim 11, wherein said hardened top portion overhangs the remainder of said upper layer of insulation material.

* * * * *